(12) United States Patent
Kim et al.

(10) Patent No.: US 7,211,769 B2
(45) Date of Patent: May 1, 2007

(54) HEATING CHAMBER AND METHOD OF HEATING A WAFER

(75) Inventors: Byung-Hee Kim, Seoul (KR); Jong-Myeong Lee, Kyungki-do (KR); Myoung-Bum Lee, Seoul (KR); Ju-Young Yun, Seoul (KR); Gil-Heyun Choi, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 209 days.

(21) Appl. No.: 10/115,111

(22) Filed: Apr. 1, 2002

(65) Prior Publication Data

US 2003/0000936 A1    Jan. 2, 2003

(30) Foreign Application Priority Data

Jun. 29, 2001    (KR) ............................... 2001-38151

(51) Int. Cl.
*F27B 5/14*    (2006.01)
(52) U.S. Cl. ...................... 219/390; 219/405; 219/411; 392/416; 392/418; 118/724; 118/725; 118/50.1
(58) Field of Classification Search ............... 219/390, 219/405, 411; 392/416, 418; 118/724, 725, 118/50.1, 728, 729, 730
See application file for complete search history.

(56) References Cited

U.S. PATENT DOCUMENTS 5,817,178 A * 10/1998 Mita et al. .................. 118/666
5,935,334 A * 8/1999 Fong et al. ................. 118/723
6,110,322 A * 8/2000 Teoh et al. ................. 156/345
6,231,674 B1 * 5/2001 Chen et al. ................. 118/720
6,303,906 B1 * 10/2001 Yoo .......................... 219/390
6,414,280 B1 * 7/2002 Nishitani et al. ........... 219/411
6,462,310 B1 * 10/2002 Ratcliff et al. .............. 219/390

FOREIGN PATENT DOCUMENTS

JP        101265690        5/1998

OTHER PUBLICATIONS

English language of Abstract for Japanese Patent Publication No. JP 10125690, Published May 15, 1998.

* cited by examiner

*Primary Examiner*—Shawntina Fuqua
(74) *Attorney, Agent, or Firm*—Marger Johnson & McCollom, P.C.

(57) ABSTRACT

A heating chamber which can be used during a reflow process to form a metal wiring having a multi-layered writing structure and a method of heating a wafer using the same, are provided. The heating chamber is movable upward and downward between the upper process position and the lower loading position, and includes a pedestal having a supporting surface for supporting a wafer, a cover installed above the pedestal to form a processing area together with the supporting surface when the pedestal is placed in its raised process position and a heating unit for heating the waver. In the method of heating the wafer, the temperature in the processing area is maintained suitable for heating the wafer before the wafer is loaded onto the supporting surface, the wafer is loaded onto the supporting surface and the loaded wafer is heating in the processing area.

19 Claims, 2 Drawing Sheets

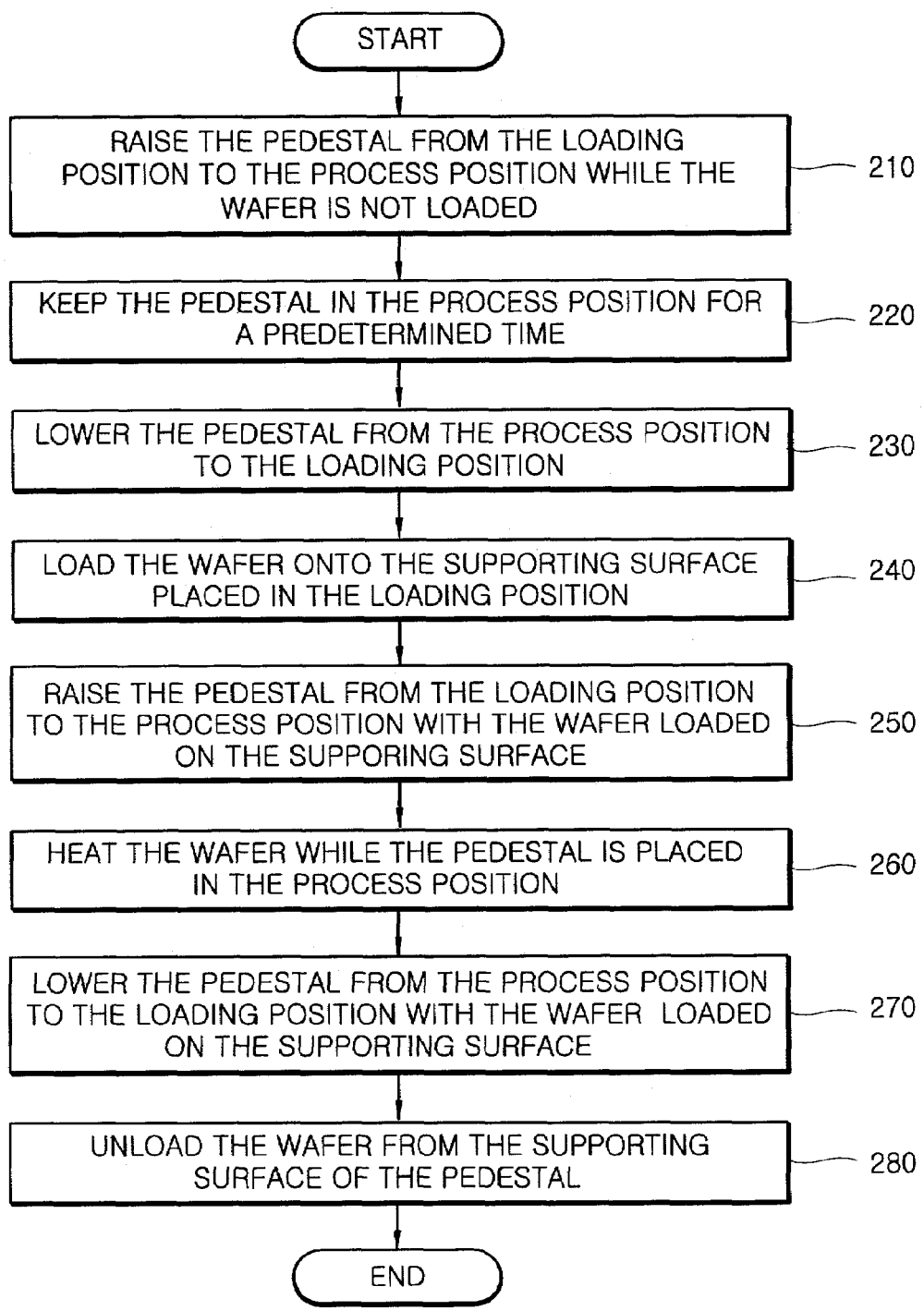

HEATING CHAMBER AND METHOD OF HEATING A WAFER

This application claims priority from Korean Patent Application No. 2001-38151, filed Jun. 29, 2001, the contents of which are incorporated herein by reference in their entirety.

BACKGROUND OF THE INVENTION

1. Field of the Invention

The present invention relates generally to a device and method for heating a semiconductor wafer. More particularly, this invention relates to a heating chamber suitable for use in a reflow process to form a metal wiring having a multi-layered wiring structure. This invention also relates to a method of heating a wafer using the heating chamber.

2. Description of Related Art

High-density and highly integrated semiconductor devices usually require multilayered metal wiring. Metal wiring is used to transmit electrical signals and an electrical resistance thereof must therefore be kept to a minimum. The metal wiring must also be economical and highly reliable. Aluminum is widely used to form the multi-layered wiring so that these requirements can be satisfied.

When using aluminum, it is important to completely fill a contact hole for connecting a device on a lower layer of a semiconductor substrate and aluminum wiring on an upper layer. Via holes for connecting aluminum wiring on a lower layer and aluminum wiring on an upper layer must also be completely filled with a metal material to electrically connect the wirings to each other. Aluminum can also be used as the metal material for filling the contact or via hole (collectively "contact holes") because it is fairly inexpensive and has excellent conductivity. Various process techniques have been used for filling a contact hole with aluminum.

While fabricating a next-generation memory device with wiring having a width of 0.25 mm or less, for example, a contact hole having a large aspect ratio is filled with aluminum. A chemical vapor deposition (CVD) process with excellent step coverage is used to form an aluminum liner in the contact hole. An aluminum film is then formed on the aluminum liner using a physical vapor deposition (PVD) method such as sputtering. The resulting aluminum structure is then heated to produce enough energy to cause the aluminum film to reflow. As a result, a contact having no void is formed. During this process, it is important to constantly maintain the desired heating temperature to cause reflow of the aluminum film. Constantly maintaining the heating temperature provides uniformity and reproducibility to the process of forming the metal wiring. Unfortunately, however, in conventional wafer heating processes, a significant amount of time is required to raise the temperature of the wafer to a desired process temperature in a heating chamber.

SUMMARY OF THE INVENTION

To solve this problem, an object of the present invention is to provide a chamber for heating a semiconductor wafer that is configured to rapidly raise the temperature of the wafer to a desired temperature during a semiconductor device fabrication process.

Another object of the present invention is to provide a method of heating a wafer wherein a time needed to raise the temperature of the wafer to a desired temperature can be shortened.

According to a preferred embodiment of this invention, a heating chamber includes a pedestal that is movable in an upward and downward direction between an upper (process) position and a lower (loading/unloading) position. The pedestal has a supporting surface that supports a wafer. The chamber further includes a cover, installed above the pedestal, which includes sidewalls and an upper wall. The cover walls and supporting surface of the pedestal collectively define a heating area when the pedestal is in the process position.

The heating chamber can further include a gas supply line for supplying an inert gas into the heating chamber and an exhaust line connected to an exhaust unit for evacuating the heating chamber. A heating unit for heating the semiconductor wafer can be located in the pedestal, in the cover, or both.

According to a preferred method for heating a semiconductor wafer, the temperature in a predetermined heating area is maintained at a proper temperature for heating a wafer, even when there is no wafer loaded on a supporting surface of a pedestal. During a loading operation, the pedestal is lowered into a loading position and a wafer is loaded onto the supporting surface of the pedestal. The pedestal is then raised back into the process position, and the wafer is quickly heated in the heating area up to the desired temperature. While heating the wafer, the pedestal is maintained in the process position for a predetermined time, with the wafer loaded on the supporting surface thereof, so that the wafer can be properly heated.

To maintain the temperature in the heating area at a proper level, the pedestal is maintained in the process position except during a loading or unloading operation, even when there is no wafer loaded onto the supporting surface of the pedestal. By keeping the pedestal in the process position whenever possible, the temperature of the heating area can easily be maintained at the proper heating temperature. After the wafer has been heated, the pedestal, with the wafer loaded on the supporting surface, can be lowered from the process position to the unloading position. The wafer is then removed from the supporting surface.

In a heating chamber constructed according to various principles of the present invention, the loss of heat from the heating area through gaps between the pedestal and the cover can be minimized. A method of heating the wafer according to another aspect of the present invention also minimizes heat loss. In particular, by keeping the pedestal in the process position even before the wafer is loaded onto the supporting surface of the pedestal, the temperature of the predetermined processing area can be more easily maintained by minimizing a loss of heat. In this manner, system throughput, as well as process uniformity and reproducibility between wafers, can be enhanced.

BRIEF DESCRIPTION OF THE DRAWINGS

The foregoing objects and advantages of the present invention will become more readily apparent through the following detailed description of preferred embodiments thereof, made with reference to the attached drawings, in which:

FIGS. 1A and 1B are schematic cross-sectional views of a heating chamber constructed according to a preferred embodiment of the present invention; wherein FIG. 1A is a schematic cross-sectional view of a heating chamber having a pedestal disposed in a loading/unloading position, and FIG. 1B is a schematic cross-sectional view of the heating chamber of FIG. 1A showing the pedestal in a process position; and FIG. 2 is a flow chart illustrating a method of heating a wafer according to another aspect of the present invention.

DETAILED DESCRIPTION OF PREFERRED EMBODIMENTS

Figure 1A:
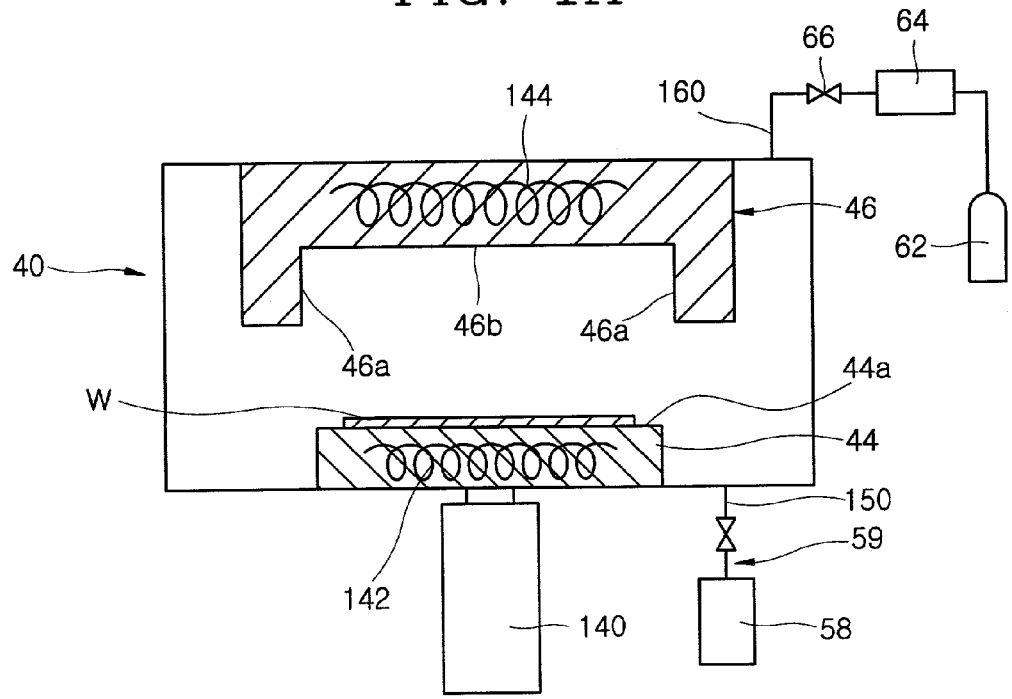
Figure 1B:
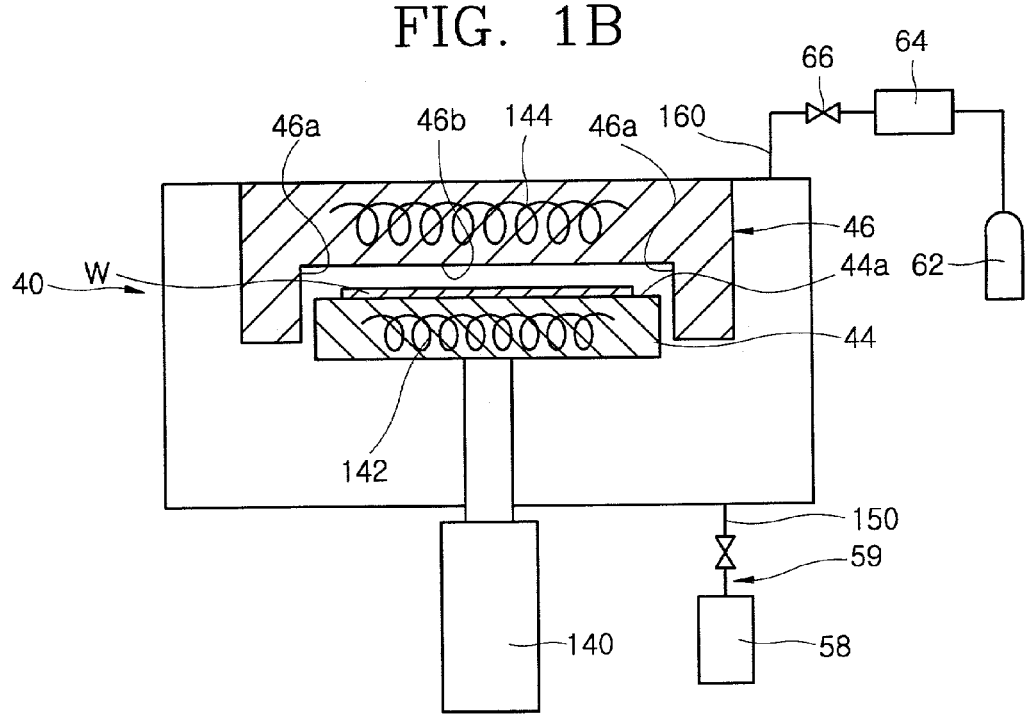

As noted above, FIGS. 1A and 1B are schematic cross-sectional views of a heating chamber constructed according to an embodiment of the present invention. Referring to FIGS. 1A and 1B, a heating chamber 40 includes a pedestal 44 having a supporting surface 44a configured to support a wafer W. The pedestal 44 is preferably movable in an upward and downward direction between an upper (process) position (FIG. 1B) and a lower (loading/unloading) position (FIG. 1A). An elevating tool 140 can be provided to control the upward and downward movement of the pedestal. A cover 46 is preferably installed above the pedestal 44 in the heating chamber 40. A predetermined heating area is defined by sidewalls 46a and an upper wall 46b of the cover 46 and the supporting surface 44a of the pedestal 44, when the pedestal 44 is disposed in the process position.

First and second heating units 142, 144 can be installed in the pedestal 44 and the cover 46, respectively, to heat the heating area to the desired temperature. It should be noted, however, that either the first heating unit 142 or the second heating unit 144 could be used independently to heat the heating area. The first and second heating units 142, 144 may be formed of resistance coils. The heating chamber 40 also preferably includes an exhaust line 150 connected to an exhaust unit 59 having an exhaust pump 58. The heating chamber 40 is evacuated through the exhaust line 150 using the exhaust unit 59. In addition, a gas supply line 160 can be connected to the heating chamber 40 to supply an inert gas 62 thereto. The flow rate of the inert gas 62 supplied through the gas supply line 160 is controlled by a mass flow controller 64 and a switching valve 66.

The pedestal 44 is disposed in a process position to permit preheating of the heating area to the desired temperature even before a wafer has been loaded onto the support surface 44a thereof. The pedestal 44 is also maintained in the process position while the wafer W is being heated. The pedestal 44 is not placed in the lower (loading/unloading) position unless a wafer W is being loaded into or unloaded from the heating chamber 40. In the raised (process) position, the supporting surface 44a of the pedestal 44 forms a predetermined heating area in combination with the sidewalls 46a and upper wall 46b of the cover 46. Accordingly, in this embodiment, the wafer W can be heated at uniform temperature because the temperature of the heating area is uniformly maintained. Raising and lowering the pedestal 44 between positions is accomplished using the elevating tool 140.

By maintaining the pedestal 44 in a process position except during wafer loading/unloading, the temperature of the heating area between the pedestal 44 and the cover 46 can be readily maintained. This is because a loss of heat through gaps between the pedestal 44 and the cover 46 is minimized. Using this setup, it is further possible to more rapidly heat the wafer W and to more easily maintain the temperature of the wafer W at a suitable level for performing a heating process during fabrication of a semiconductor device.

FIG. 2 is a flow chart illustrating a method of heating a wafer according to another embodiment of the present invention. A heating chamber 40, such as the one shown in FIGS. 1A and 1B, can be used. Referring to FIG. 2, before loading the wafer W onto the supporting surface 44a, the temperature of the predetermined processing area is raised to a level suitable for heating the wafer W, with the pedestal disposed in the process position. The method of heating the wafer W according to the present invention will be described below.

First, the pedestal 44 is disposed in the process position without a wafer W loaded on the supporting surface 44a (step 210) thereof. The pedestal 44 is kept in the process position for a predetermined amount of time, so that the temperature of the heating area reaches and is maintained at a level suitable for heating the wafer W (step 220). The predetermined heating area is preferably heated to and kept at a temperature of about 350–500° C., using the first and second heating units 142, 144. Alternatively, the heating may be performed using only the first heating unit 142 installed into the pedestal 44, or the second heating unit 144 installed in the cover 46, in which case the temperature of the processing area is controlled using only a single heating unit.

There are several reasons to bring the predetermined heating area up to a proper temperature for heating the wafer W before loading the wafer W onto the supporting surface 44a. Among other things, if the pedestal 44 is kept in the loading/unloading position for a long time before the wafer W is loaded onto the supporting surface 44a thereof, and if the pedestal 44 is moved into the process position only after the wafer W has been loaded thereon, then the cover 46 cannot successfully function to maintain the temperature in the heating area. As a result, a significant amount of heat is lost and a longer period of time is required to raise the temperature inside the heating area up to a proper level for heating the wafer W.

According to the foregoing embodiments of the present invention, however, the pedestal 44 is kept in the process position even during a time period before the wafer W is loaded onto the supporting surface 44a thereof. In other words, the pedestal 44 is maintained in the process position even during a waiting period, during which the process of heating the wafer W is not being carried out in the heating chamber 40. By maintaining the pedestal 44 in the process position as much as possible, loss of heat from the heating area, which is defined by the supporting surface 44a of the pedestal 44 and the sidewalls 46a, and the upper wall 46b of the cover 46, can be minimized. Also, the temperature inside the heating area can easily be maintained at a level suitable for performing the subsequent process of heating the wafer W.

After preheating the predetermined processing area, the pedestal 44 is lowered from the process position to the loading/unloading position (step 230), and the wafer W is loaded onto the supporting surface 44a of the pedestal 44 (step 240). The pedestal 44 is then raised from the loading/unloading position to the process position with the wafer W loaded on the supporting surface 44a (step 250). The loaded wafer W is then heated while the pedestal 44 is kept in the process position for a predetermined time period (step 260).

This process of heating the wafer W may be used during a reflow process for forming metal wiring on the wafer W. Specifically, a metal wiring can be formed on the wafer W by first depositing an aluminum film or aluminum alloy film to completely fill a contact hole or via hole on the wafer W and by then heating the film to be reflowed at a high temperature in an inert atmosphere (such as an Ar atmosphere) for several minutes. The method of heating the wafer W described in the foregoing embodiments provides a very effective heating process for causing reflow of the aluminum film or aluminum alloy film. According to this method, the loaded wafer W is preferably heated to about 350–500° C.

In addition to achieving the proper temperature, the heating process for the reflow must further be performed under conditions in which oxidization of the surface of the aluminum film or aluminum alloy film is suppressed. The heating chamber 40 is therefore preferably evacuated to as low a pressure as possible so that heating the wafer W can be performed in a vacuum atmosphere. More particularly, the pressure in the heating chamber 40 is preferably maintained below about 10–6 Torr, providing a high vacuum state. Further, an inert gas is preferably supplied to the heating chamber 40 via the gas supply line 160 so that the loaded wafer W is heated in an inert atmosphere.

After completing the process of heating the wafer W, the pedestal 44 is lowered from the process position to the unloading position with the wafer W on the supporting surface 44*a* (step 270) thereof. The wafer W is then unloaded from the supporting surface 44*a* while the pedestal is maintained in the unloading position (step 280). After unloading, the pedestal 44 returns to the process position regardless of whether or not another wafer has been loaded thereon.

As described above, a heating chamber according to an embodiment of the present invention is movable in an upward and downward direction between an upper (process) position and a lower (loading/unloading) position. A pedestal includes a supporting surface for supporting the wafer, and a cover is installed in the heating chamber above the pedestal. A predetermined heating area is formed from the combination of the cover and the upper surface of the pedestal, when the pedestal is disposed in the process position. Using this configuration, it is easy to control the raising and lowering of the pedestal, and loss of heat from the predetermined heating area between the pedestal and the cover can be minimized by maintaining the pedestal in the process position as much as possible. As a result, it is possible to readily maintain the temperature of the heating area and to rapidly heat the wafer W while fabricating a semiconductor device.

Further, in a method of heating the wafer according to another aspect of the present invention, the temperature of the predetermined heating area is raised to and maintained at a level suitable for heating the wafer before the wafer is loaded onto the supporting surface. The pedestal is kept in the process position except when the wafer W is being loaded onto or unloaded from the supporting surface of the pedestal. In other words, during a waiting time, when the process of heating the wafer W is not being performed in the heating chamber, the pedestal is kept in the process position to maintain the temperature of the heating area. Maintaining the heat in the processing area, which is defined by the supporting surface of the pedestal and the inner walls of the cover, minimizes heat loss and speeds up the wafer heating process. It is therefore possible to shorten the time required to heat the wafer to the process temperature for the subsequent wafer heating process. Accordingly, throughput, as well as process uniformity and reproducibility between wafers heated in the heating chamber, can be enhanced by maintaining the temperature of a heating area during the fabrication process.

Although the present invention has been particularly shown and described with reference to preferred embodiments thereof, the present invention is not restricted to the foregoing embodiments. It will be understood by those skilled in the art that various changes in form and details may be made to the embodiments described herein without departing from the spirit and scope of the invention as defined by the appended claims.

What is claimed is:

1. A heating chamber comprising:
    a pedestal movable between a process position and a loading position, said pedestal comprising a supporting surface configured to support a wafer;
    a cover disposed within the heating chamber and above the pedestal, said cover comprising sidewalls and an upper wall that together with the supporting surface of the pedestal define a heating area when the pedestal is disposed in the process position, said supporting surface and said cover configured to uniformly maintain the temperature of the heating area;
    a first resistance coil for heating the wafer, wherein the first resistance coil is installed within the pedestal; and
    a second resistance coil for heating the wafer, wherein the second resistance coil is installed within the cover.

2. The heating chamber according to claim 1, further comprising:
    a gas supply line configured to supply an inert gas to the heating chamber; and
    an exhaust line connected to an exhaust unit, said exhaust unit adapted to evacuate the heating chamber.

3. A method of heating a wafer, said method comprising:
    preheating a processing area to a desired temperature, said desired temperature being equal to an upper temperature limit for a wafer heating process;
    maintaining the desired temperature in the processing area during a time in which the wafer is not positioned within the processing area;
    loading the wafer into the processing area; and heating the wafer to the desired temperature solely by the uniform diffusion of heat from the processing area to the wafer.

4. The method according to claim 3, wherein maintaining the desired temperature in the processing area comprises:
    arranging a pedestal and a cover in a process position during a time period in which the wafer is not loaded on a supporting surface of the pedestal; and
    keeping the pedestal and the cover in the process position for a predetermined time to maintain the desired temperature in the processing area.

5. The method according to claim 4, wherein a heating unit is used to maintain the desired temperature in the processing area, and wherein the desired temperature is between about 350–500° C.

6. The method according to claim 5, wherein the heating unit comprises a first heating unit installed within the pedestal.

7. The method according to claim 5, wherein the heating unit comprises:
    a first heating unit installed within the pedestal; and
    a second heating unit installed within the cover.

8. The method according to claim 4, further comprising loading the wafer onto the supporting surface by moving the pedestal from the process position to the loading position; and placing the wafer onto the supporting surface of the pedestal while the pedestal is in the loading position.

9. The method according to claim 8, wherein heating the wafer comprises:
    moving the pedestal from the loading position to the process position with the wafer loaded on the supporting surface of the pedestal; and maintaining the pedestal, having the wafer supported thereon, in the process position for a predetermined time, so that the wafer is heated.

10. The method according to claim 7, wherein heating the wafer is performed at about 350–500° C.

11. The method according to claim 3, wherein heating the wafer is performed in a vacuum atmosphere.

12. The method according to claim 3, wherein heating the wafer is performed in an inert gas atmosphere.

13. The method according to claim 3, wherein a metal film for filling a contact hole or via hole is exposed on the upper surface of the wafer.

14. The method according to claim 13, wherein the metal film is an aluminum film or aluminum alloy film.

15. The method according to claim 14, wherein the aluminum film is reflowed while heating the wafer.

16. The method according to claim 13, further comprising:
   lowering the pedestal from the process position to an unloading position with the wafer positioned on the supporting surface of the pedestal; and
   unloading the wafer from the supporting surface of the pedestal while the pedestal is placed in the unloading position.

17. An apparatus for heating a wafer during a semiconductor fabrication process, said apparatus comprising:
   a heating chamber;
   a pedestal comprising a supporting surface for supporting a wafer, said pedestal arranged in a lower portion of the heating chamber and capable of upwards and downwards movement in the heating chamber;
   a cover disposed in the heating chamber above the pedestal, said cover configured to define a predetermined heating area in combination with the supporting surface of the pedestal when the pedestal is in an uppermost position, said cover and said supporting surface configured to uniformly maintain the temperature of the heating area;
   a first resistance coil installed within the pedestal;
   a second resistance coil installed within the cover;
   an elevation unit configured to control the upwards and downwards movement of the pedestal; and
   an evacuation unit configured to create a vacuum atmosphere within the heating chamber during a heating process.

18. The apparatus according to claim 17, further comprising a gas supply to supply an inert gas to the heating chamber during the heating process.

19. The apparatus according to claim 18, wherein the gas supply comprises a gas supply line connected to the heating chamber and a gas supply tank configured to supply gas to the gas supply line through a mass flow controller and a switching valve.

* * * * *